(12) United States Patent
Kotchaplayuk et al.

(10) Patent No.: US 12,389,800 B2
(45) Date of Patent: Aug. 12, 2025

(54) SINGLE LINE DRIVE CIRCUIT ENABLING IDENTICAL ACTUATOR ORIENTATION

(71) Applicant: Magnecomp Corporation, Murrieta, CA (US)

(72) Inventors: Treesoon Kotchaplayuk, Wangnoi (TH); Johnathan Hy-Tho Phu, San Gabriel, CA (US); Kuen Chee Ee, Chino, CA (US); David Glaess, Bangkok (TH); Piyawech Keawlai, Wangnoi (TH)

(73) Assignee: Magnecomp Corporation, Murrieta, CA (US)

( * ) Notice: Subject to any disclaimer, the term of this patent is extended or adjusted under 35 U.S.C. 154(b) by 939 days.

(21) Appl. No.: 17/529,134

(22) Filed: Nov. 17, 2021

(65) Prior Publication Data

US 2022/0165930 A1     May 26, 2022

Related U.S. Application Data (60) Provisional application No. 63/116,722, filed on Nov. 20, 2020.

(51) Int. Cl.
*H10N 30/80*     (2023.01)
*G11B 5/48*     (2006.01)
(Continued)

(52) U.S. Cl.
CPC .......... *H10N 30/802* (2023.02); *G11B 5/483* (2015.09); *H10N 30/206* (2023.02); *H10N 30/50* (2023.02);
(Continued)

(58) Field of Classification Search
CPC .... H10N 30/802; H10N 30/206; H10N 30/50; H10N 30/8554; H10N 30/872; H10N 30/87; G11B 5/483
See application file for complete search history.

(56) References Cited

U.S. PATENT DOCUMENTS 6,490,119 B1    12/2002   Mittal et al.
6,580,687 B1 *   6/2003   Cumpson ............. G11B 5/5552
(Continued)

OTHER PUBLICATIONS

International Search Report and Written Opinion in International Application No. PCT/US2021/059968, mailed Feb. 4, 2022.
(Continued)

*Primary Examiner* — Emily P Pham
(74) *Attorney, Agent, or Firm* — DLA Piper LLP (US)

(57) ABSTRACT

A driving circuit is described. The driving circuit includes: a first piezoelectric actuator including at least one piezoelectric element disposed between a first electrode and a second electrode, the first electrode configured to connected to a first ground at a first terminal and the second electrode configured to connected to an amplifier at a second terminal. The driving circuit includes a second piezoelectric actuator including at least one piezoelectric element disposed between a first electrode and a second electrode, the first electrode configured to connected to a control signal at a first terminal and the second electrode connected to a second ground at a second terminal. And, the first terminal of the first piezoelectric actuator and the first terminal of the second piezoelectric actuator are configured such that the first piezoelectric actuator and the second piezoelectric actuator are symmetrical and have similar polarity.

21 Claims, 5 Drawing Sheets

(51) Int. Cl.
  *H10N 30/20* (2023.01)
  *H10N 30/50* (2023.01)
  *H10N 30/853* (2023.01)
  *H10N 30/87* (2023.01)

(52) U.S. Cl.
  CPC ....... *H10N 30/8554* (2023.02); *H10N 30/872* (2023.02)

(56) References Cited

U.S. PATENT DOCUMENTS

| | | | |
|---|---|---|---|
| 8,605,383 B1 * | 12/2013 | Wang | G11B 5/4873 |
| | | | 360/75 |
| 9,627,602 B1 * | 4/2017 | Guzik | H10N 30/802 |
| 10,891,979 B1 * | 1/2021 | Ryan | G11B 5/59627 |
| 2017/0279029 A1 | 9/2017 | Miyamoto | |
| 2018/0068683 A1 | 3/2018 | Bjorstrom et al. | |

OTHER PUBLICATIONS

International Preliminary Report on Patentability in International Application No. PCT/US2021/059968, mailed Jun. 1, 2023.

* cited by examiner

| PZT layer | PZT Thk. (um) | PZT length (mm) | PZT Orientation | Active portion | Stroke (nm/V) |
|---|---|---|---|---|---|
| 3 | 15/15/15 | 0.63 | Opposite | Asymmetry | 8.99 |
| 3 | 15/15/15 | 0.63 | Same | Symmetry | 10.05 |

SINGLE LINE DRIVE CIRCUIT ENABLING IDENTICAL ACTUATOR ORIENTATION

CROSS-REFERENCE TO RELATED APPLICATIONS

This application claims the benefit of U.S. Provisional Application No. 63/116,722 filed on Nov. 20, 2020, which is hereby incorporated by reference in its entirety.

FIELD

This disclosure relates to the field of piezoelectric actuators. More particularly, this disclosure relates to improving performance of piezoelectric actuators.

DESCRIPTION OF RELATED ART

A hard disk drive is known as a type of information storage device. A hard disk drive typically includes one or more magnetic disks rotatably mounted in association with a spindle and one or more actuator assemblies for positioning a magnetic transducer, or head, relative to concentric circular data tracks on a magnetic medium-bearing surface of each disk.

The recording densities of hard disk drives have been increasing with advances in personal computers, so that data tracks are becoming increasingly more densely positioned on the disks, and the tracks themselves are becoming physically narrower. As a result, maintaining the transducer or head in an accurate track-following position for purposes of reading and writing, is becoming more difficult. To accommodate the needed increasingly finer adjustments in the position of the magnetic head, a precision positioning actuator has been introduced. For such an actuator, a single piezoelectric actuator assembly is generally employed. The piezoelectric actuator forms a part of a head gimbal assembly which moves the head transverse to a track to provide fine radial positioning of a head in reference to a track.

SUMMARY

A driving circuit is described. The driving circuit includes: a first piezoelectric actuator including at least one piezoelectric element disposed between a first electrode and a second electrode, the first electrode configured to connected to a first ground at a first terminal and the second electrode configured to connected to an amplifier at a second terminal. The driving circuit includes a second piezoelectric actuator including at least one piezoelectric element disposed between a first electrode and a second electrode, the first electrode configured to connected to a control signal at a first terminal and the second electrode connected to a second ground at a second terminal. And, the first terminal of the first piezoelectric actuator and the first terminal of the second piezoelectric actuator are configured such that the first piezoelectric actuator and the second piezoelectric actuator are symmetrical and have similar polarity.

In some examples of the driving circuit, the first piezoelectric actuator includes a first piezoelectric element, a second piezoelectric element, and a third piezoelectric element. The first piezoelectric element may include a top surface partially covered by a portion of the first electrode and a portion of the second electrode, where the second electrode covers more of the top surface of the first piezoelectric element than the first electrode. The first piezoelectric element and the second piezoelectric element are partially separated by the first electrode, which is connected to the first ground. The second piezoelectric element and the third piezoelectric element may be partially separated by the second electrode. The third piezoelectric element may include a bottom surface partially covered by a portion of the first electrode and a portion of the second electrode, where the second electrode covers less of the bottom surface of the third piezoelectric element than the first electrode.

In some examples of the driving circuit, the second piezoelectric actuator includes a first piezoelectric element, a second piezoelectric element, and a third piezoelectric element. The first piezoelectric element may include a top surface partially covered by a portion of the first electrode and a portion of the second electrode, where the second electrode covers more of the top surface of the first piezoelectric element than the first electrode. The first piezoelectric element and the second piezoelectric element are partially separated by the first electrode. The second piezoelectric element and the third piezoelectric element may be partially separated by second electrode. The third piezoelectric element may have a bottom surface partially covered by a portion of the first electrode and a portion of the second electrode, where the second electrode covers less of the bottom surface of the third piezoelectric element than the first electrode.

In some examples of the driving circuit, the first piezoelectric actuator is configured to be driven in response to a control signal applied via the second terminal from the amplifier. In some examples of the driving circuit, the second piezoelectric actuator is configured to be driven in response to a control signal applied via the first terminal from the amplifier. In some examples, the driving circuit also includes a head slider. The similar polarity and the symmetry of the first piezoelectric actuator and the second piezoelectric actuator enable fine radial positioning of the head slider.

A suspension device is also provided. The suspension device includes a driving circuit, which includes a first piezoelectric actuator comprising at least one piezoelectric element disposed between a first electrode and a second electrode, the first electrode connected to a first ground at a first terminal and the second electrode connected to an amplifier at a second terminal. The driving circuit also includes a second piezoelectric actuator comprising at least one piezoelectric element disposed between a first electrode and a second electrode. The first electrode is connected to the amplifier at a first terminal and the second electrode connected to a second ground at a second terminal. The first terminal of the first piezoelectric actuator and the first terminal of the second piezoelectric actuator are positioned such that the first piezoelectric actuator and the second piezoelectric actuator have similar polarity and orientation.

While multiple examples are disclosed, still other examples of the present disclosure will become apparent to those skilled in the art from the following detailed description, which shows and describes illustrative examples of this disclosure. Accordingly, the drawings and detailed description are to be regarded as illustrative in nature and not restrictive.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure and are therefore not to be considered as limiting of its scope. The principles are described and explained with additional specificity and detail using the following drawings.

DETAILED DESCRIPTION

Figure 1:
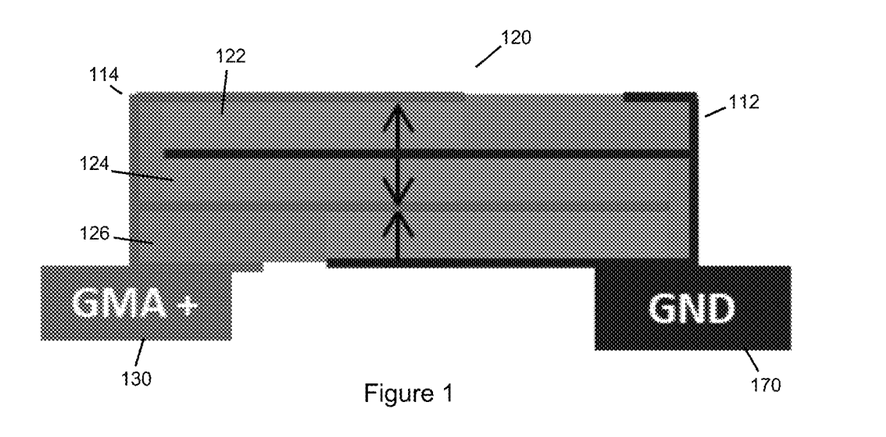
FIG. 1 illustrates a side sectional view of a first piezoelectric actuator for a driving circuit, in accordance with an example of the disclosure.

FIG. 1 illustrate a side sectional view of a first piezoelectric actuator 120 having a first polarity. The first piezoelectric actuator 120 has a first electrode 112 that is configured to connected to a first reference potential, for example, a zero potential (e.g., a ground). The first piezoelectric actuator 120 also has a second electrode 114 is configured to connect to a control signal 130. The first piezoelectric actuator 120 includes a first piezoelectric element 122, a second piezoelectric element 124, and a third piezoelectric element 126. The first piezoelectric element 122 has a top surface partially covered by a portion of the first electrode 112 and a portion of the second electrode 114. The second electrode 114 covers more of the top surface of the first piezoelectric element 122 than the first electrode 112. The first piezoelectric element 122 and the second piezoelectric element 124 are partially separated by the first electrode 112. Moreover, the second piezoelectric element 124 and the third piezoelectric element 126 are partially separated by second electrode 114. The third piezoelectric element 126 has a bottom surface partially covered by a portion of the first electrode 112 and a portion of the second electrode 114. The second electrode 114 covers less of the bottom surface of the third piezoelectric element 126 than the first electrode 112.

Under the illustrated poling directions in FIG. 1, when a positive voltage is applied and the electric field is in the same direction as the poling direction across the first electrode 112 and the second electrode 114, all three piezoelectric elements 122, 124, and 126 expand in the longitudinal direction.

Figure 2:
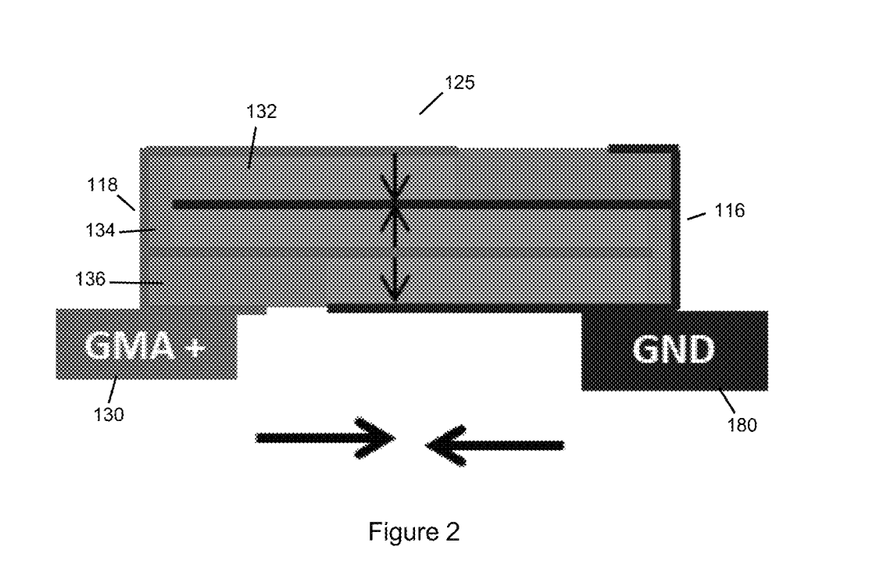
FIG. 2 illustrates a side sectional view of a second piezoelectric actuator, in accordance with an example of the disclosure.

FIG. 2 illustrates a side sectional view of a second piezoelectric actuator 125 having a second polarity opposite the first polarity. The second piezoelectric actuator 125 has a first electrode 116 that is configured to connect to a first reference potential, for example, a zero potential (e.g., the second ground 180). The second piezoelectric actuator 125 also has a second electrode 118 is connected to a control signal 130. The second piezoelectric actuator 125 includes a first piezoelectric element 132, a second piezoelectric element 134, and a third piezoelectric element 136. The first piezoelectric element 132 has a top surface partially covered by a portion of the first electrode 116 and a portion of the second electrode 118.

The second electrode 118 covers more of the top surface of the first piezoelectric element 132 than the first electrode 116. The first piezoelectric element 132 and the second piezoelectric element 134 are partially separated by the first electrode 116. Moreover, the second piezoelectric element 134 and the third piezoelectric element 136 are partially separated by second electrode 118. The third piezoelectric element 136 has a bottom surface partially covered by a portion of the first electrode 116 and a portion of the second electrode 118. The second electrode 118 covers less of the bottom surface of the third piezoelectric element 136 than the first electrode 116.

Under the illustrated poling directions as illustrated in FIG. 2, when a positive voltage is applied and the electric field is in the opposite direction of the poling direction across the first electrode 116 and the second electrode 118, all three piezoelectric elements 132, 134, and 136 contract in the longitudinal direction.

Figure 3:
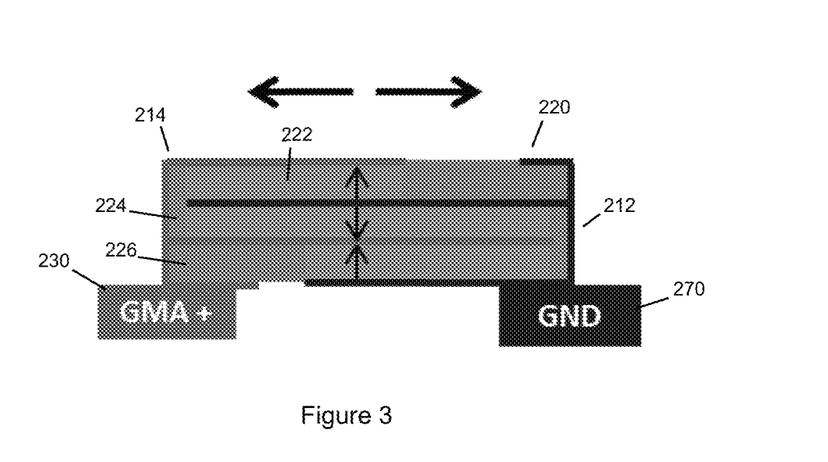
FIG. 3 illustrates a side sectional view of a first piezoelectric actuator, in accordance with an example of the disclosure.

FIG. 3 illustrates a side sectional view of the first piezoelectric actuator 220 for a driving circuit. The first piezoelectric actuator 220 has a first electrode 212 that is configured to connect to a first reference potential, for example, a zero potential (e.g., a ground). The first piezoelectric actuator 220 also has a second electrode 214 connected to a control signal 230. The first piezoelectric actuator 220 includes a first piezoelectric element 222, a second piezoelectric element 224, and a third piezoelectric element 226. The first piezoelectric element 222 has a top surface partially covered by a portion of the first electrode 212 and a portion of the second electrode 214.

The second electrode 214 covers more of the top surface of the first piezoelectric element 222 than the first electrode 212. The first piezoelectric element 222 and the second piezoelectric element 224 are partially separated by the first electrode 212. Moreover, the second piezoelectric element 224 and the third piezoelectric element 226 are partially separated by second electrode 214. The third piezoelectric element 226 has a bottom surface partially covered by a portion of the first electrode 212 and a portion of the second electrode 214. The second electrode 214 covers less of the bottom surface of the third piezoelectric element 226 than the first electrode 212.

Under the illustrated poling directions in FIG. 3, when a positive voltage is applied and the electric field is in the same direction as the poling direction across the first electrode 212 and the second electrode 214, all three piezoelectric elements 222, 224, and 226 expand in the longitudinal direction.

Figure 4:
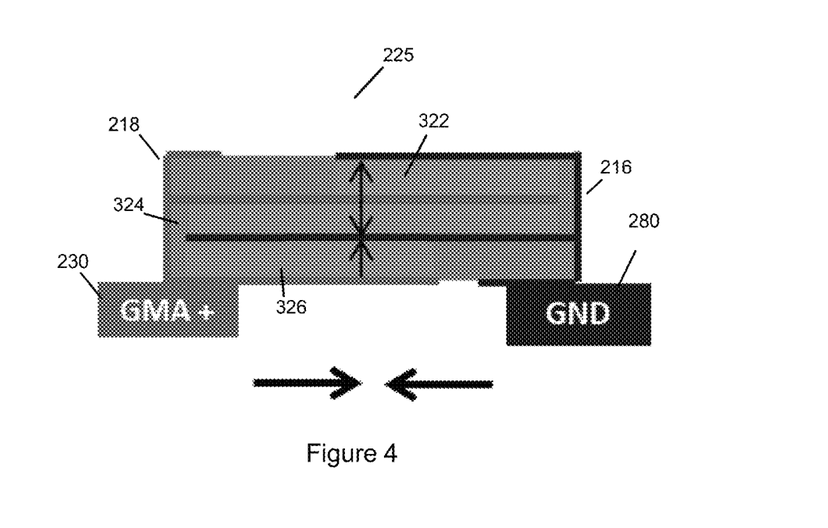
FIG. 4 illustrates a side sectional view of a second piezoelectric actuator, in accordance with an example of the disclosure.

FIG. 4 illustrates a side sectional view of the second piezoelectric actuator 225 of the driving circuit, in accordance with an example of the disclosure. The second piezoelectric actuator 225 has a first electrode 216 that is connected to a first reference potential, for example, a zero potential (e.g., a ground). The second piezoelectric actuator 225 also has a second electrode 218 connected to the control signal 230. The second piezoelectric actuator 225 includes a first piezoelectric element 322, a second piezoelectric element 324, and a third piezoelectric element 326. The first piezoelectric element 322 has a top surface partially covered by a portion of the first electrode 216 and a portion of the second electrode 218.

In contrast to the first piezoelectric actuator 220 of FIG. 3, the second electrode 218 covers less of the top surface of the first piezoelectric element 322 than the first electrode 216. This is because the second piezoelectric actuator 225 is rotated 180 degrees from the orientation of the second piezoelectric actuator 125 of FIG. 2. The first piezoelectric element 322 and the second piezoelectric element 324 are partially separated by the second electrode 218. Moreover, the second piezoelectric element 324 and the third piezoelectric element 326 are partially separated by first electrode 216. The third piezoelectric element 326 has a bottom surface partially covered by a portion of the first electrode 216 and a portion of the second electrode 218. The second electrode 218 covers more of the bottom surface of the third piezoelectric element 326 than the first electrode 216.

Under the illustrated poling directions in FIG. 4, when a positive voltage is applied such that the electric field is in an opposite direction of the poling direction across the first electrode 216 and the second electrode 218, all three piezoelectric elements 322, 324, and 326 contract in the longitudinal direction.

Figure 5:
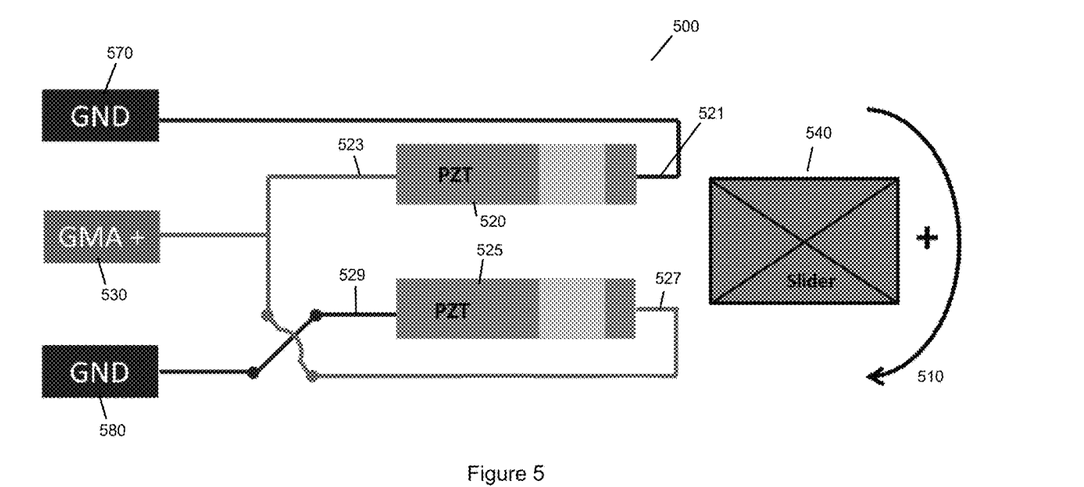
FIG. 5 illustrates a driving circuit architecture, in accordance with an example of the disclosure.

FIG. 5 is a driving circuit 500, in accordance with an example of the disclosure. The driving circuit 500 includes a first piezoelectric actuator 520 and a second piezoelectric actuator 525 configured to move a head slider 540 of a suspension for a hard disk drive. The first piezoelectric actuator 520 and the second piezoelectric actuator 525 are each electrically coupled with the driving circuit 500. As a result, the first piezoelectric actuator 520 and the second piezoelectric actuator 525 are responsive to an applied voltage control signal applied to affect a desired physical displacement of a head slider using techniques including those know in the prior art. This is discussed in greater detail below with respect to FIGS. 6-7.

The driving circuit 500 is configured to be incorporated in a suspension device of a hard disk drive, such as a head gimbal assembly. The first piezoelectric actuator 520 includes a first terminal 521 (or reference terminal), and a second terminal 523. The first piezoelectric actuator 520 is connected to a first ground contact 570 at the first terminal 521. The first piezoelectric actuator 520 is also connected to a control signal 530 at the second terminal 523. The second piezoelectric actuator 525 includes a first terminal 527 (e.g., a reference terminal), and a second terminal 529. The second piezoelectric actuator 525 is connected to a second ground contact 580 at the second terminal 529. The second piezoelectric actuator 525 is also connected to the control signal 530 at the first terminal 527. In other words, the first and second terminals 527, 529 of the second piezoelectric actuator 525 are switched and the first and second piezoelectric actuators 520, 525 have the same polarity and orientation. And, the active portions 528, 538 are arranged such that they are symmetrical. This is further illustrated in FIGS. 6-7.

Figure 6:
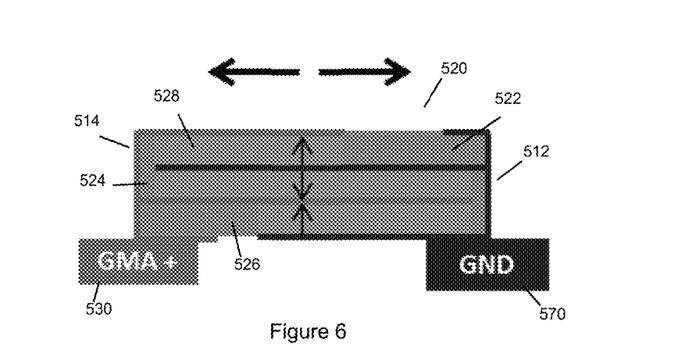
FIG. 6 illustrates a side sectional view of a first piezoelectric actuator of the driving circuit architecture of FIG. 5, in accordance with an example of the disclosure.

FIG. 6 illustrates a side sectional view of the first piezoelectric actuator 520 of the driving circuit architecture 500, in accordance with an example of the disclosure. The first piezoelectric actuator 520 has a first electrode 512 that is connected to a first reference potential, for example, zero potential (e.g., through the first ground contact 570). The first piezoelectric actuator 520 also has a second electrode 514 connected to the control signal 530. The first piezoelectric actuator 520 includes a first piezoelectric element 522, a second piezoelectric element 524, and a third piezoelectric element 526. The first piezoelectric element 522 has a top surface partially covered by a portion of the first electrode 512 and a portion of the second electrode 514.

The second electrode 514 covers more of the top surface of the first piezoelectric element 522 than the first electrode 512. The first piezoelectric element 522 and the second piezoelectric element 524 are partially separated by the first electrode 512, which is grounded. Moreover, the second piezoelectric element 524 and the third piezoelectric element 526 are partially separated by second electrode 514. The third piezoelectric element 526 has a bottom surface partially covered by a portion of the first electrode 512 and a portion of the second electrode 514. The second electrode 514 covers less of the bottom surface of the third piezoelectric element 526 than the first electrode 512, which is grounded. The first piezoelectric actuator 520 includes an active portion 528 that includes a portion of the first piezoelectric element 522 between the second electrode 514 and the first electrode 512; a portion of the second piezoelectric element 524 between the first electrode 512 and the second electrode 514; and a portion of the third piezoelectric element 526 between the second element 514 and the first element 512.

Under the illustrated poling directions in FIG. 6, when a positive voltage is applied such that the electric field is in the same direction as the poling direction across the first electrode 512 and the second electrode 514, all three piezoelectric elements 522, 524, and 526 expand in the longitudinal direction.

Figure 7:
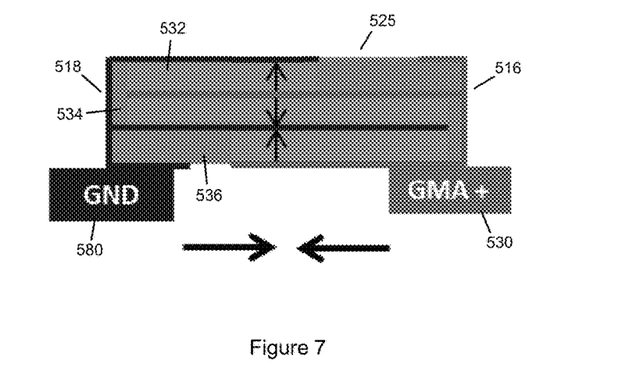
FIG. 7 illustrates a side sectional view of a second piezoelectric actuator of the driving circuit architecture of FIG. 5, in accordance with an example of the disclosure.

FIG. 7 illustrates a side sectional view of the second piezoelectric actuator 525 of the driving circuit 500, in accordance with an example of the disclosure. The second piezoelectric actuator 525 has a first electrode 516 that is connected to the control signal 530. The second piezoelectric actuator 525 also has a second electrode 518 connected to a first reference potential, for example, zero potential (e.g., through the second ground contact 580). The second piezoelectric actuator 525 includes a first piezoelectric element 532, a second piezoelectric element 534, and a third piezoelectric element 536. The first piezoelectric element 532 has a top surface partially covered by a portion of the first electrode 516 and a portion of the second electrode 518.

The second (grounded) electrode 518 covers more of the top surface of the first piezoelectric element 532 than the first electrode 516. The first piezoelectric element 532 and the second piezoelectric element 534 are partially separated by the first electrode 516. Moreover, the second piezoelectric element 534 and the third piezoelectric element 536 are partially separated by second electrode 518. The third piezoelectric element 536 has a bottom surface partially covered by a portion of the first electrode 516 and a portion of the second electrode 518. The second electrode 518 covers less of the bottom surface of the third piezoelectric element 536 than the first electrode 516. The second piezoelectric actuator 525 includes an active portion 538 that includes a portion of the piezoelectric element 532 between the second electrode 518 and the first electrode 516; a portion of the second piezoelectric element 534 between the first electrode 516 and the second electrode 518; and a portion of the third piezoelectric element 536 between the second element 518 and the first element 516.

Under the illustrated poling directions in FIG. 7, when a positive voltage is applied such that the electric field is in opposite direction of poling direction across the first electrode 516 and the second electrode 518, all three piezoelectric elements 532, 534, and 536 contract in the longitudinal direction.

Referring back to FIG. 5, the first piezoelectric actuator 520 and the second piezoelectric actuator 525 are similarly poled. Moreover, the structures of the first piezoelectric actuator 520 and the second piezoelectric actuator 525 are arranged in a symmetrical orientation and each having the same polarity. The first piezoelectric actuator 520 is configured to be driven in response to a control signal 530 applied via the second (input) terminal 523. Similarly, the second piezoelectric actuator 525 is configured to be driven in response to a control signal 530 applied via the first (input) terminal 527. The control signals affect mechanical deformation of the piezoelectric elements, as discussed above, of the first and second piezoelectric actuators 520, 525. The similar polarity and the symmetry of the first piezoelectric actuator 520 and the second piezoelectric actuator 525 enable fine radial positioning of the head slider 540 in direction 510. The similar polarity and the symmetry of the first piezoelectric actuator 520 and the second piezoelectric actuator 525 also improve sway mode gain and torsion mode gain sensitivity, as compared to current systems that rely on actuators having an opposite orientation and asymmetric active portions.

Figure 8:
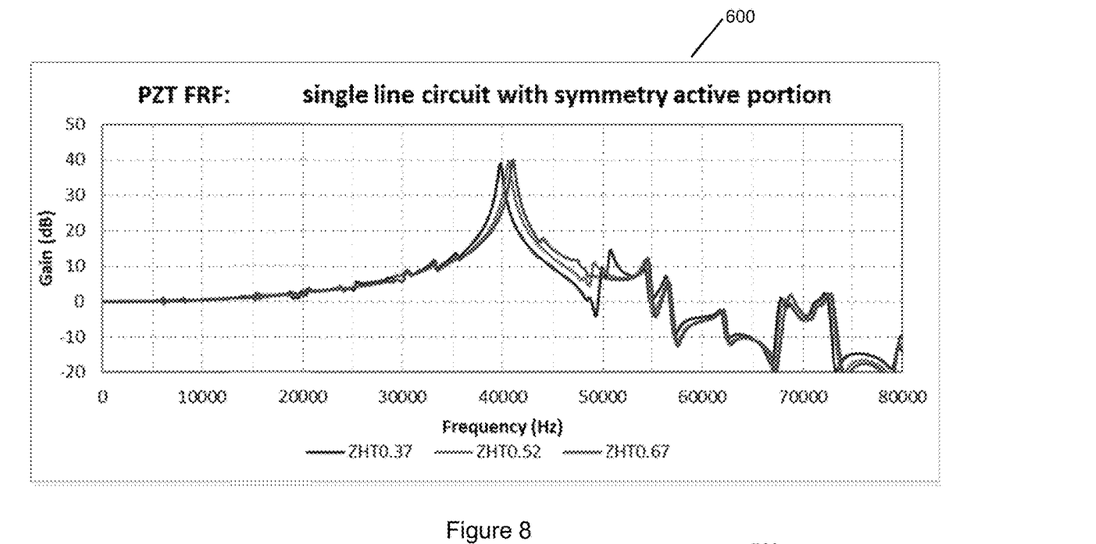
FIG. 8 is a graph of the PZT frequency response function of a suspension incorporating the driving circuit architecture, in accordance with an example of the disclosure.
Figure 9:
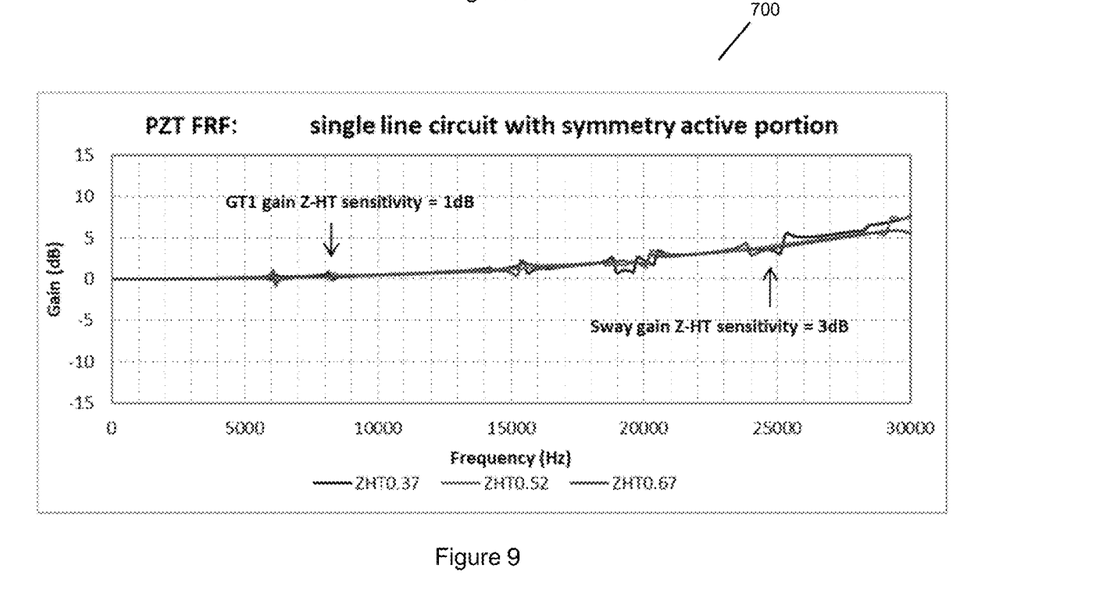
FIG. 9 is a graph of the PZT frequency response function of a suspension incorporating the driving circuit architecture, in accordance with an example of the disclosure.

FIG. 8 is a graph 600 of the PZT frequency response function (0-80 kHz) of a suspension incorporating driving circuit according to some embodiments described herein, according to a simulation. FIG. 9 is a graph 700 of the PZT frequency response function (0-30 kHz) of a suspension incorporating driving circuit according to some embodiments described herein, according to a simulation. As indicated in FIG. 9, the suspension exhibited torsion mode gain sensitivity of 1 dB and sway mode gain sensitivity of 3 dB. The lower sway mode gain and torsion mode gain sensitivity increase head positioning control loop bandwidth, which translates to both lower data seek times and lower susceptibility to vibrations.

Figure 10:
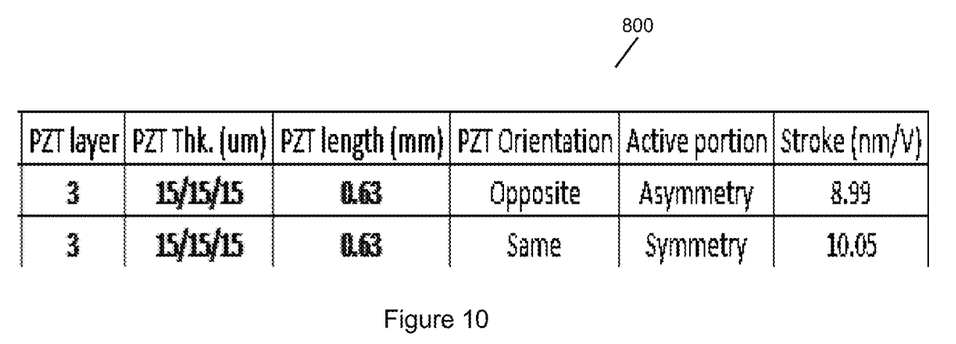
FIG. 10 is a table illustrating a stroke of a suspension incorporating the driving circuit according to some embodiments described herein, in accordance with an example of the disclosure.

FIG. 10 is a table 800 illustrating the stroke of a suspension incorporating the driving circuit according to some embodiments described herein compared to a suspension incorporating current techniques including asymmetric arrangement of the active portions and opposite actuator orientation, according to a simulation. As illustrated herein, the suspension incorporating the driving circuit according to some embodiments described herein with actuators with the same orientation and symmetric active portions exhibited a stroke of 10.05 nm/V. In comparison, the suspension incorporating the asymmetric arrangement of the active portions of the actuators exhibited a stroke of 8.99 nm/V. Therefore, the suspension incorporating the driving circuit according to some embodiments described herein exhibited a stroke increase. For the example illustrated in FIG. 10, the driving circuit according to embodiments described herein exhibited stroke increase of 11% compared to the suspension incorporating the asymmetric arrangement and opposite actuator orientation.

Figure 11:
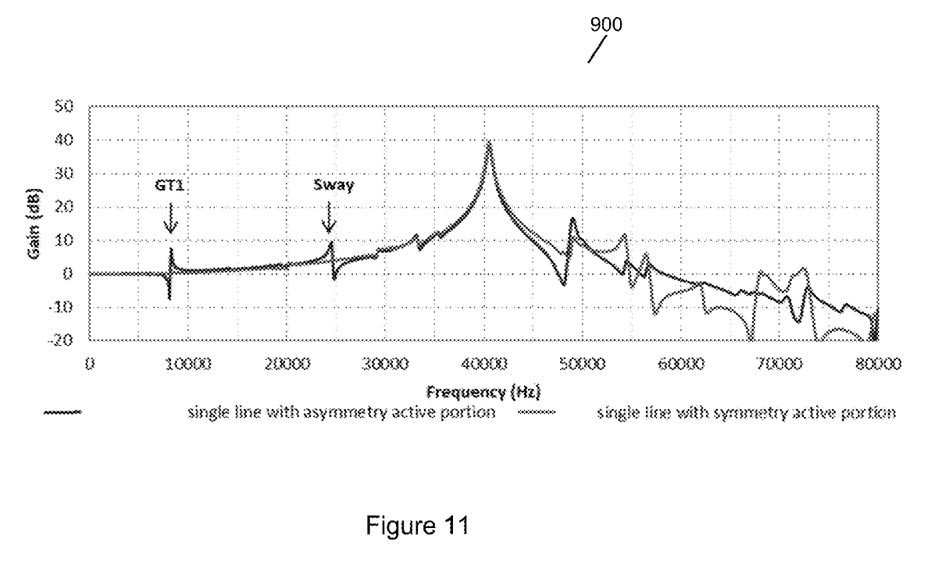
FIG. 11 is a graph comparing the PZT frequency response function of a suspension incorporating, according to a simulation.

FIG. 11 is a graph 900 comparing the PZT frequency response function of a suspension incorporating driving circuit 500 to the PZT frequency response function of a suspension incorporating current techniques including asymmetric arrangement of the active portions and opposite actuator orientation, according to a simulation. As illustrated in FIG. 11, the suspension incorporating driving circuit according to some embodiments described herein exhibited lower sway mode gain and torsion mode gain sensitivity.

It will be understood that the terms "generally," "approximately," "about," "substantially," and "coplanar" as used within the specification and the claims herein allow for a certain amount of variation from any exact dimensions, measurements, and arrangements, and that those terms should be understood within the context of the description and operation of the present disclosure.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise. Thus, unless expressly stated otherwise, each feature disclosed is one example only of a generic series of equivalent or similar features.

It will be appreciated that the term "example" as used herein should not be construed to mean that only a single example having a single essential element or group of elements is presented. Similarly, it will also be appreciated that the term "present disclosure" encompasses a number of separate innovations which can each be considered separate examples. Although the present disclosure has thus been described in detail with regard to the preferred examples and drawings thereof, it should be apparent to those skilled in the art that various adaptations and modifications of the present disclosure may be accomplished without departing from the spirit and the scope of the present disclosure. Accordingly, it is to be understood that the detailed description and the accompanying drawings as set forth hereinabove are not intended to limit the breadth of the present disclosure, which should be inferred only from the following claims and their appropriately construed legal equivalents.

We claim:

1. A driving circuit comprising:
a first piezoelectric actuator including at least one piezoelectric element disposed between a first electrode and a second electrode, the first electrode configured to connected to a first ground at a first terminal and the second electrode configured to connected to an amplifier at a second terminal and wherein the first piezoelectric actuator includes a first piezoelectric element, the first piezoelectric element having a top surface partially covered by a portion of the first electrode and a portion of the second electrode, and the second electrode covers more of the top surface of the first piezoelectric element than the first electrode; and
a second piezoelectric actuator including at least one piezoelectric element disposed between a first electrode and a second electrode, the first electrode configured to connected to a control signal at a first terminal and the second electrode connected to a second ground at a second terminal, and wherein the second piezoelectric actuator includes a first piezoelectric element, the first piezoelectric element having a top surface partially covered by a portion of the first electrode and a portion of the second electrode, and the second electrode covers more of the top surface of the first piezoelectric element than the first electrode, the first terminal of the first piezoelectric actuator and the first terminal of the second piezoelectric actuator are configured such that the first piezoelectric actuator and the second piezoelectric actuator are symmetrical and have similar polarity.

2. The driving circuit of claim 1, wherein the first piezoelectric actuator further includes a second piezoelectric element and a third piezoelectric element.

3. The driving circuit of claim 2, wherein the first piezoelectric element and the second piezoelectric element are partially separated by the first electrode, which is connected to the first ground.

4. The driving circuit of claim 2, wherein the second piezoelectric element and the third piezoelectric element are partially separated by the second electrode.

5. The driving circuit of claim 2, wherein the third piezoelectric element includes a bottom surface partially covered by a portion of the first electrode and a portion of the second electrode, the second electrode covers less of the bottom surface of the third piezoelectric element than the first electrode.

6. The driving circuit of claim 1, wherein the second piezoelectric actuator further includes a second piezoelectric element and a third piezoelectric element.

7. The driving circuit of claim 6, wherein the first piezoelectric element and the second piezoelectric element are partially separated by the first electrode.

8. The driving circuit of claim 6, wherein the second piezoelectric element and the third piezoelectric element are partially separated by second electrode.

9. The driving circuit of claim 6, wherein the third piezoelectric element has a bottom surface partially covered by a portion of the first electrode and a portion of the second electrode, the second electrode covers less of the bottom surface of the third piezoelectric element than the first electrode.

10. The driving circuit of claim 1, wherein the first piezoelectric actuator is configured to be driven in response to the control signal applied via the second terminal.

11. The driving circuit of claim 1, wherein the second piezoelectric actuator is configured to be driven in response to the control signal applied via the first terminal.

12. The driving circuit of claim 1, comprising a head slider,
wherein the first piezoelectric actuator and the second piezoelectric actuator that are symmetrical and have similar polarity enable fine radial positioning of the head slider.

13. A suspension device comprising:
a driving circuit comprising:
a first piezoelectric actuator including at least one piezoelectric element disposed between a first electrode and a second electrode, the first electrode configured to connect to a first ground at a first terminal and the second electrode configured to connect to a control signal at a second terminal and wherein the first piezoelectric actuator includes a first piezoelectric element, the first piezoelectric element having a top surface partially covered by a portion of the first electrode and a portion of the second electrode, and the second electrode covers more of the top surface of the first piezoelectric element than the first electrode; and a second piezoelectric actuator including at least one piezoelectric element disposed between a first electrode and a second electrode, the first electrode configured to connect to a control signal at a first terminal and the second electrode configured to connect to a second ground at a second terminal, and wherein the second piezoelectric actuator includes a first piezoelectric element, the first piezoelectric element having a top surface partially covered by a portion of the first electrode and a portion of the second electrode, and the second electrode covers more of the top surface of the first piezoelectric element than the first electrode, the first terminal of the first piezoelectric actuator and the first terminal of the second piezoelectric actuator are configured such that the first piezoelectric actuator and the second piezoelectric actuator are symmetrical and have similar polarity.

14. The suspension device of claim 13, wherein the first piezoelectric actuator further includes a second piezoelectric element and a third piezoelectric element.

15. The suspension device of claim 13, wherein the second piezoelectric actuator further includes a second piezoelectric element and a third piezoelectric element.

16. The suspension device of claim 13, wherein the first piezoelectric actuator is configured to be driven in response to the control signal applied via the second terminal.

17. The suspension device of claim 13, wherein the second piezoelectric actuator is configured to be driven in response to the control signal applied via the first terminal.

18. The suspension device of claim 13, comprising a head slider,
wherein the first piezoelectric actuator and the second piezoelectric actuator that are symmetrical and have similar polarity enable fine radial positioning of the head slider.

19. A suspension device comprising:
a driving circuit comprising:
a first piezoelectric actuator including at least one piezoelectric element disposed between a first electrode and a second electrode, the first electrode configured to connect to a first ground at a first terminal and the second electrode configured to connect to a control signal at a second terminal and wherein the first piezoelectric actuator includes a first piezoelectric element, the first piezoelectric element having a top surface partially covered by a portion of the first electrode and a portion of the second electrode, and the first electrode covers more of the top surface of the first piezoelectric element than the second electrode; and a second piezoelectric actuator including at least one piezoelectric element disposed between a first electrode and a second electrode, the first electrode configured to connect to a control signal at a first terminal and the second electrode configured to connect to a second ground at a second terminal, and wherein the second piezoelectric actuator includes a first piezoelectric element, the first piezoelectric element having a top surface partially covered by a portion of the first electrode and a portion of the second electrode, and the first electrode covers more of the top surface of the first piezoelectric element than the second electrode, the first terminal of the first piezoelectric actuator and the first terminal of the second piezoelectric actuator are configured such that the first piezoelectric actuator and the second piezoelectric actuator are symmetrical and have similar polarity.

20. The suspension device of claim 19, wherein the second piezoelectric actuator further includes a second piezoelectric element and a third piezoelectric element.

21. The suspension device of claim 20, wherein the third piezoelectric element has a bottom surface partially covered by a portion of the first electrode and a portion of the second electrode, and the second electrode covers more of the bottom surface of the third piezoelectric element than the first electrode.

\* \* \* \* \*